(12) United States Patent
Ehrlich et al.

(10) Patent No.: US 10,332,729 B2
(45) Date of Patent: *Jun. 25, 2019

(54) COMPRESSION MEMBER FOR USE IN SHOWERHEAD ELECTRODE ASSEMBLY

(71) Applicant: LAM RESEARCH CORPORATION, Fremont, CA (US)

(72) Inventors: Darrell Ehrlich, San Jose, CA (US); Daniel Arthur Brown, Brentwood, CA (US); Ian Kenworthy, Campbell, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/895,367

(22) Filed: Feb. 13, 2018

(65) Prior Publication Data

US 2018/0174804 A1 Jun. 21, 2018

Related U.S. Application Data

(60) Continuation of application No. 14/710,100, filed on May 12, 2015, now Pat. No. 9,922,804, which is a division of application No. 13/467,652, filed on May 9, 2012, now Pat. No. 9,058,960.

(51) Int. Cl.
*H01J 37/32* (2006.01)
*H01L 21/3065* (2006.01)
*C23C 16/455* (2006.01)

(52) U.S. Cl.
CPC .... *H01J 37/32541* (2013.01); *H01J 37/3244* (2013.01); *H01J 37/32091* (2013.01); *H01J 37/32522* (2013.01); *H01L 21/3065* (2013.01); *C23C 16/4557* (2013.01); *Y10T 29/49002* (2015.01); *Y10T 29/49083* (2015.01); *Y10T 29/49098* (2015.01); *Y10T 29/49117* (2015.01); *Y10T 29/49803* (2015.01)

(58) Field of Classification Search
CPC ............ H01J 37/3244; H01J 37/32541; H01J 37/32522; H01J 37/32091; Y10T 29/49002; Y10T 29/49098; Y10T 29/49083; Y10T 29/49117; Y10T 29/49803; C23C 16/4557; H01L 21/3065
USPC ........ 239/128; 29/592.1; 118/715, 724, 725; 156/345.33, 345.34, 345.37
See application file for complete search history.

(56) References Cited

U.S. PATENT DOCUMENTS

| 6,388,218 B1 | 5/2002 | Ando et al. |
| 7,645,341 B2 | 1/2010 | Kennedy et al. |
| 7,699,634 B2 | 4/2010 | Kholodenko et al. |

(Continued)

OTHER PUBLICATIONS

U.S. Appl. No. 14/710,100, filed May 12, 2015.
U.S. Appl. No. 13/467,652, filed May 9, 2012.

*Primary Examiner* — Jeffrie R Lund (57) ABSTRACT

A compression member for use in a showerhead electrode assembly of a capacitively coupled plasma chamber. The member applies a compression force to a portion of a film heater adjacent a power supply boot on an upper surface of a thermal control plate and is located between the thermal control plate and a temperature-controlled top plate. The member is composed of an electrically insulating elastomeric material which can work over a large range of compressions and temperatures.

18 Claims, 7 Drawing Sheets

(56) References Cited

U.S. PATENT DOCUMENTS

| | | | |
|---|---|---|---|
| 7,862,682 B2 | 1/2011 | Stevenson et al. | |
| 8,080,107 B2 | 12/2011 | Kennedy et al. | |
| 8,484,846 B2 * | 7/2013 | Dhindsa | H01J 37/3244 |
| | | | 156/345.34 |
| 8,701,268 B2 * | 4/2014 | Larson | H05K 13/00 |
| | | | 29/592.1 |
| 9,058,960 B2 | 6/2015 | Ehrlich et al. | |
| 9,064,909 B2 * | 6/2015 | Dhindsa | H01J 37/3244 |
| 9,245,716 B2 * | 1/2016 | de la Llera | H01J 37/32091 |
| 9,922,804 B2 * | 3/2018 | Ehrlich | H01J 37/3244 |
| 2007/0215285 A1 | 9/2007 | Kimball et al. | |
| 2008/0087641 A1 | 4/2008 | De La Llera et al. | |
| 2008/0099120 A1 | 5/2008 | Larson et al. | |
| 2009/0163034 A1 | 6/2009 | Larson et al. | |
| 2010/0003824 A1 | 1/2010 | Kadkhodayan et al. | |
| 2010/0003829 A1 | 1/2010 | Patrick et al. | |
| 2010/0184298 A1 | 7/2010 | Dhindsa | |
| 2010/0261354 A1 | 10/2010 | Bettencourt et al. | |
| 2011/0070740 A1 | 3/2011 | Bettencourt et al. | |
| 2011/0083809 A1 | 4/2011 | de la Llera et al. | |
| 2012/0175062 A1 | 7/2012 | de la Llera et al. | |
| 2013/0287489 A1 | 10/2013 | Laurin et al. | |
| 2013/0299605 A1 | 11/2013 | Ehrlich et al. | |
| 2015/0243487 A1 | 8/2015 | Ehrlich et al. | |
| 2018/0174804 A1 * | 6/2018 | Ehrlich | H01J 37/3244 |

\* cited by examiner

COMPRESSION MEMBER FOR USE IN SHOWERHEAD ELECTRODE ASSEMBLY

CROSS-REFERENCE TO RELATED APPLICATIONS

This application is a continuation of U.S. application Ser. No. 14/710,100, filed May 12, 2015, which is a divisional application of U.S. application Ser. No. 13/467,652, filed May 9, 2012. The entire disclosures of the applications referenced above are incorporated herein by reference.

FIELD

The invention relates to plasma processing apparatuses wherein a resistance heater film is used to control the temperature of a thermal control plate in a showerhead electrode assembly.

BACKGROUND

The Plasma processing apparatuses are used to process substrates by techniques including etching, physical vapor deposition (PVD), chemical vapor deposition (CVD), ion implantation, and resist removal. One type of plasma processing apparatus used in plasma processing includes a reaction chamber containing upper and bottom electrodes. An electric field is established between the electrodes to excite a process gas into the plasma state to process substrates in the reaction chamber.

One type of upper electrode assembly used in plasma processing includes a showerhead electrode assembly. A showerhead electrode assembly of a plasma processing apparatus may include a thermal control plate attached to a showerhead electrode, and a top plate attached to the thermal control plate. At least one thermal bridge can be provided between opposed surfaces of the thermal control plate and the top plate to allow electrical and thermal conduction between the thermal control plate and top plate. A thermally and electrically conductive gasket may separate the top plate and the showerhead electrode, as described in commonly-owned U.S. Pat. No. 7,862,682, which is incorporated herein by reference in its entirety. A single zone or multi-zone film heater supported by the thermal control plate may cooperate with the temperature-controlled top plate to maintain the showerhead electrode at a desired temperature, as described in commonly-owned U.S. Pat. No. 7,645,341, which is incorporated herein by reference in its entirety.

SUMMARY

Disclosed herein is a compression member for use in a showerhead electrode assembly of a capacitively coupled plasma chamber wherein the member applies a compression force to a portion of a film heater adjacent a power supply boot on an upper surface of a thermal control plate supported below a temperature-controlled top plate.

In a preferred embodiment the compression member is a body of electrically insulating elastomeric material compressed between the temperature-controlled top plate and the thermal control plate wherein a lower surface of the body contacts an upper surface of the film heater and applies a compression force to a portion of the film heater and an inner surface of the compression member is adjacent to a power supply boot which supplies power to the film heater.

DETAILED DESCRIPTION

Disclosed herein is a compression member for use in a showerhead electrode assembly, wherein the compression member applies a resilient force to prevent delamination of a film heater on a thermal control plate. When a film heater is laminated to an upper surface of a thermal control plate, certain plasma processing conditions may cause the film heater to undergo delamination in an area adjacent to a power supply boot providing electrical power to the film heater. Application of a compression force around the area adjacent to the power supply boot is intended to avoid delamination of the film heater on the thermal control plate.

Figure 1:
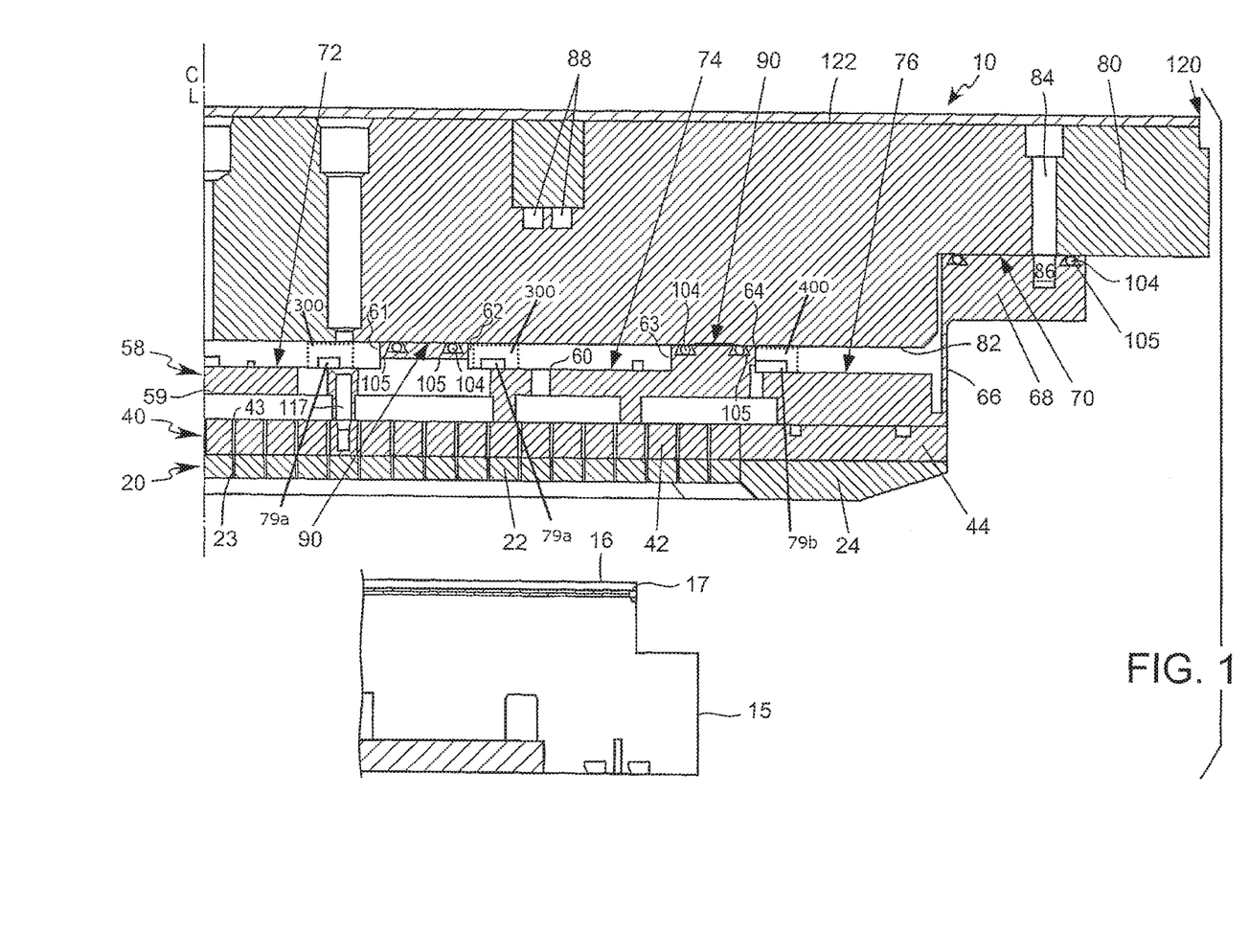
FIG. 1 illustrates a portion of a showerhead electrode assembly and a substrate support for a plasma processing apparatus which has compression members adjacent to power supply boots.

FIG. 1 illustrates a showerhead electrode assembly 10 for a plasma processing apparatus in which semiconductor substrates, e.g., silicon wafers, are processed. The showerhead electrode assembly 10 (only one-half of which is shown in FIG. 1) includes a top electrode 20 and an optional backing member 40 secured to the top electrode 20, a thermal control plate 58, and a top plate 80. The top plate 80 can form a removable top wall of the plasma processing apparatus, such as a plasma etch chamber.

A substrate support 15 (only a portion of which is shown in FIG. 1) including a bottom electrode and optional electrostatic clamping electrode is positioned beneath the top electrode 20 in the vacuum processing chamber of the plasma processing apparatus. A substrate 16 subjected to plasma processing is mechanically or electrostatically clamped on an upper support surface 17 of an electrostatic clam (ESC) incorporated in the substrate support 15.

The showerhead electrode 20 preferably includes an inner electrode member 22, and an optional outer electrode member 24. The inner electrode member 22 is preferably a cylindrical plate (e.g., single crystal silicon). The inner electrode member 22 can have a diameter smaller than, equal to, or larger than a wafer to be processed, e.g., up to 12 inches (300 mm) or larger (e.g., 450 mm) of single crystal silicon. For processing 300 mm wafers, the outer electrode member 24 is provided to expand the diameter of the top electrode 20 from about 15 inches to about 17 inches. The outer electrode member 24 can be a continuous member (e.g., a poly-silicon member, such as a ring), or a segmented member (e.g., 2-6 separate segments arranged in a ring configuration, such as segments of single crystal silicon). In embodiments of the top electrode 20 that include a multiple-segment outer electrode member 24, the segments preferably have edges which overlap each other to protect an underlying bonding material from exposure to plasma. The inner electrode member 22 preferably includes multiple gas passages 23 for injecting a process gas into a space in a plasma reaction chamber between the top electrode 20 and bottom electrode 15. Alternatively, instead of inner and outer electrodes, the electrode can be a monolithic electrode with or without a backing member.

The backing member 40 preferably includes a backing plate 42 and a backing ring 44. In such embodiments, the inner electrode member 22 is co-extensive with the backing plate 42, and the outer electrode member 24 is co-extensive with the surrounding backing ring 44. However, the backing plate 42 can extend beyond the inner electrode member such that a single backing plate can be used to support the inner electrode member and the segmented outer electrode member. The inner electrode member 22 and the outer electrode member 24 are preferably attached to the backing member 40 by a bonding material, such as an elastomeric bonding material. The backing plate 42 includes gas passages 43 aligned with the gas passages 23 in the inner electrode member 22 to provide gas flow into the plasma processing chamber. The gas passages 43 can have a diameter of about 0.04 inch, ("about" as used herein means±10%) and the gas passages 23 can typically have a diameter of about 0.025 inch.

The thermal control plate 58 comprises a metallic inner portion including a contoured plate 59 with an upper surface 60, and a first annular projection 61 having a first heat transfer surface 62 and a second annular projection 63 having a second heat transfer surface 64 on the upper surface. In other preferred embodiments, the thermal control plate 58 can include more than two projections, e.g., three or more projections. The thermal control plate 58 also includes a flexure portion 66 connecting the contoured plate 59 to a flange 68 having an upper surface 70 which is held against an opposed lower surface 82 of temperature-controlled top plate 80. The first heat transfer surface 62 and second heat transfer surface 64 preferably have an annular configuration. The first projection 61 and the second projection 63 preferably have a height of from about 0.25 inch to about 0.75 inch, and a width of from about 0.75 inch to about 1.25 inch. However, the first projection 61 and/or second projection 63 can have a non-annular configuration, e.g., arcuate segment, polyhedral, round, oval or other configuration. The top plate 80 preferably includes one or more flow passages 88 through which a temperature-controlled fluid, preferably a liquid, can be circulated to maintain the top plate 80 at a desired temperature.

The thermal control plate 58 is removably attached to the top plate 80 with suitable fasteners, which extend through the openings 84 in the top plate 80 and into threaded openings 86 formed in the flange 68. In one embodiment, the showerhead electrode assembly 10 comprises a cover plate 120 attached to the top side 122 of the top plate 80. The cover plate 120 seals the openings in the top plate 80 such that the fasteners in these openings are at vacuum pressure in the processing apparatus. However, the cover plate can be omitted by providing a vacuum seal around the openings 84, 86, (e.g., O-rings 104 can be provided in spaced-apart annular grooves 105 around sections containing openings 84, 86). The oversized openings 84 in the top plate 80 provide clearances around the fasteners so that the thermal control plate 58 can slide relative to the top plate to accommodate mismatch in thermal expansion of the thermal control plate relative to the top plate.

During processing of a semiconductor substrate in the processing chamber, heat is transferred from the inner electrode member 22 and the outer electrode member 24 and the optional backing plate 42 and optional backing ring 44 to the lower surface 82 of the top plate 80 via thermal conduction from the first heat transfer surface 62, second heat transfer surface 64, and through upper surface 70. In other words, the first projection 61 and second projection 63 also provide thermal bridges between the inner electrode member 22, outer electrode member 24, backing plate 42 and backing ring 44 to the top plate 80. This enhanced heat transfer at spaced locations across the thermal control plate 58 helps achieve a substantially uniform temperature distribution radially across the top electrode 20.

Figure 2:
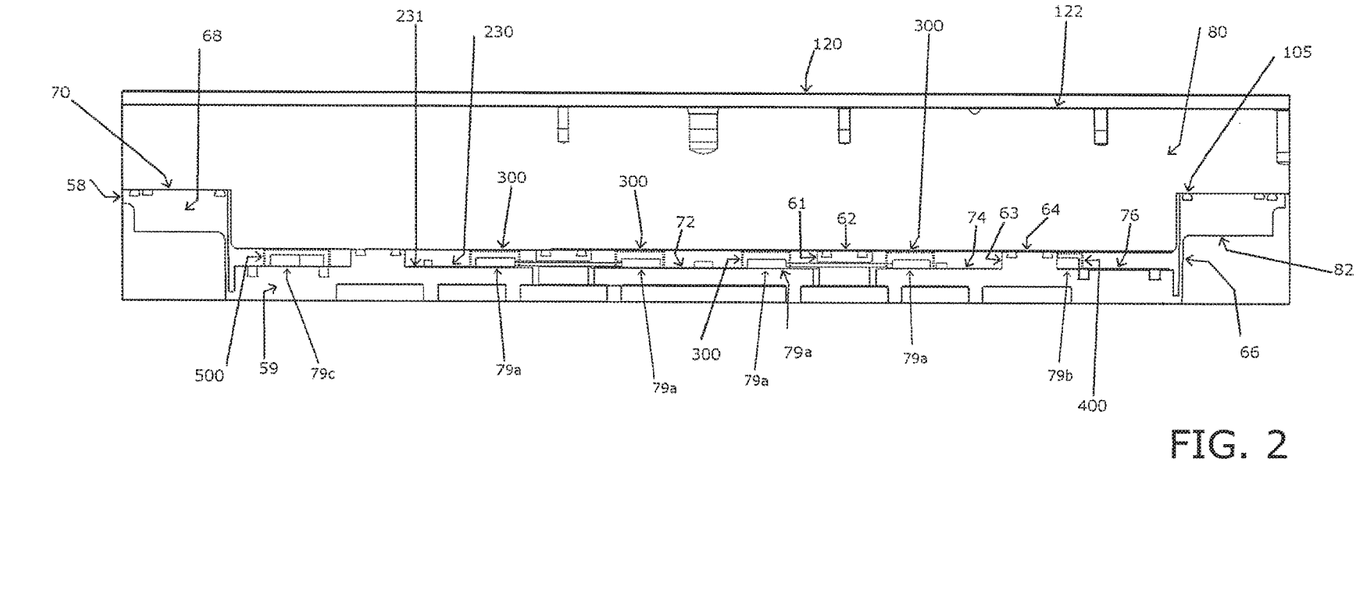
FIG. 2 illustrates a showerhead electrode assembly in accordance with a preferred embodiment which has compression members adjacent to power supply boots.

With reference to FIG. 2, the thermal control plate 58 preferably includes at least one film heater 230 operable to cooperate with the temperature-controlled top plate 80 to control the temperature of the top electrode 20. For example, in a preferred embodiment, the heater is provided on the upper surface of the thermal control plate 58 and includes a film heater 230$a$ in a first annular heater zone 72 surrounded by the first projection 61, a film heater 230$b$ in a second annular heater zone 74 between the first projection 61 and the second projection 63, and a film heater 230$c$ in a third annular heater zone 76 between the second projection 63 and the flexure portion 66 (see FIG. 6A). The number of heater zones can be varied; for example, in other embodiments the heater can include a single heater zone, two heater zones, or more than three heater zones.

In a preferred embodiment, the film heater 230 is divided into three film heaters 230$a$, 230$b$, 230$c$, by first projection 61 and second projection 63 on the thermal control plate 58. Film heater 230$a$ is located in the first heater zone 72 and is electrically connected to film heater 230$b$ located in the second heater 74 via electrical connections which extend through the first projection 61. Film heater 230$c$ is located in the third heater zone 76 and is electrically connected to film heater 230$b$ via electrical connections which extend through the second projection 63 (see FIG. 6A). As illustrated in FIG. 6B, power supply 110 is electrically connected to power supply boot 79$c$ via a power line 97. Power supply boots 79$c$ are used to distribute power to resistive heating lines 232 in the film heater 230$c$.

The film heater 230$a$, $b$, $c$ comprises a laminate including resistive heating lines 232 (FIG. 6B) on the upper surface 60 of the thermal control plate 58 wherein the heating lines are formed from electrical resistance heating material disposed between opposed layers of a polymeric material that can withstand the operating temperatures reached by the film heater 230$a$, $b$, $c$. An exemplary polymeric material that can be used is a polyimide sold under the trademark "KAPTON" which is commercially available from E.I. du Pont de Nemours and Company. Heating of the thermal control plate is preferably achieved via thermal conduction.

The heating lines can have any suitable pattern that provides for thermally uniform heating of the first heater zone 72, second heater zone 74, and third heater zone 76. For example, the film heater 230$a$, $b$, $c$ can have a regular or non-regular pattern of resistive heating lines such as a zig-zag, serpentine, or concentric pattern. By heating the thermal control plate 58 with the film heater 230$a$, $b$, $c$, in cooperation with cooling by the temperature-controlled top plate 80, a desirable temperature distribution can be provided across the top electrode 20 during operation of the showerhead electrode assembly 10.

Figure 6A:
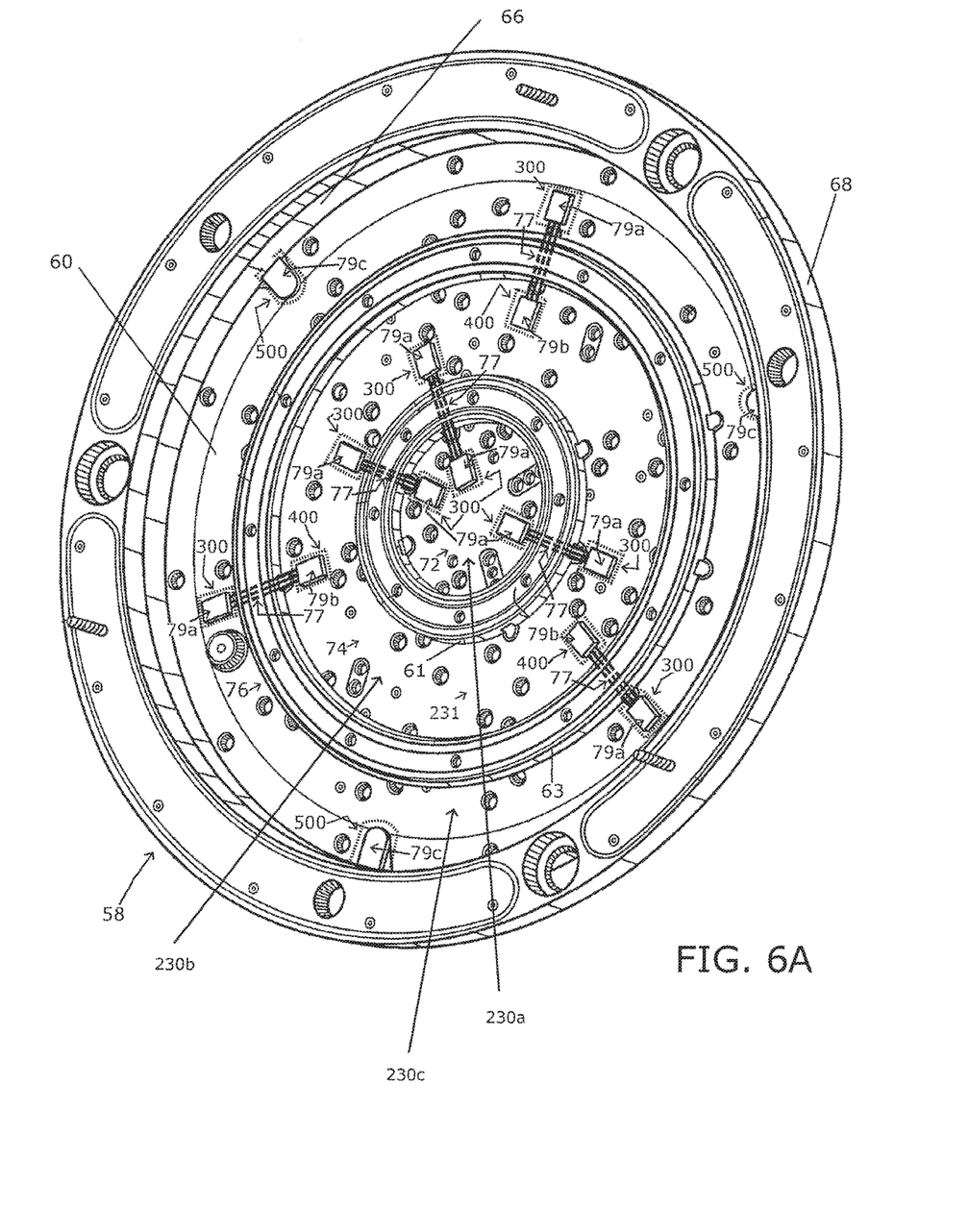
FIG. 6A,B illustrate top views of a thermal control plate 58 detailing a preferred arrangement of compression members 300, 400, 500. In the drawings, reference numbers may be reused to identify similar and/or identical elements.
Figure 6B:
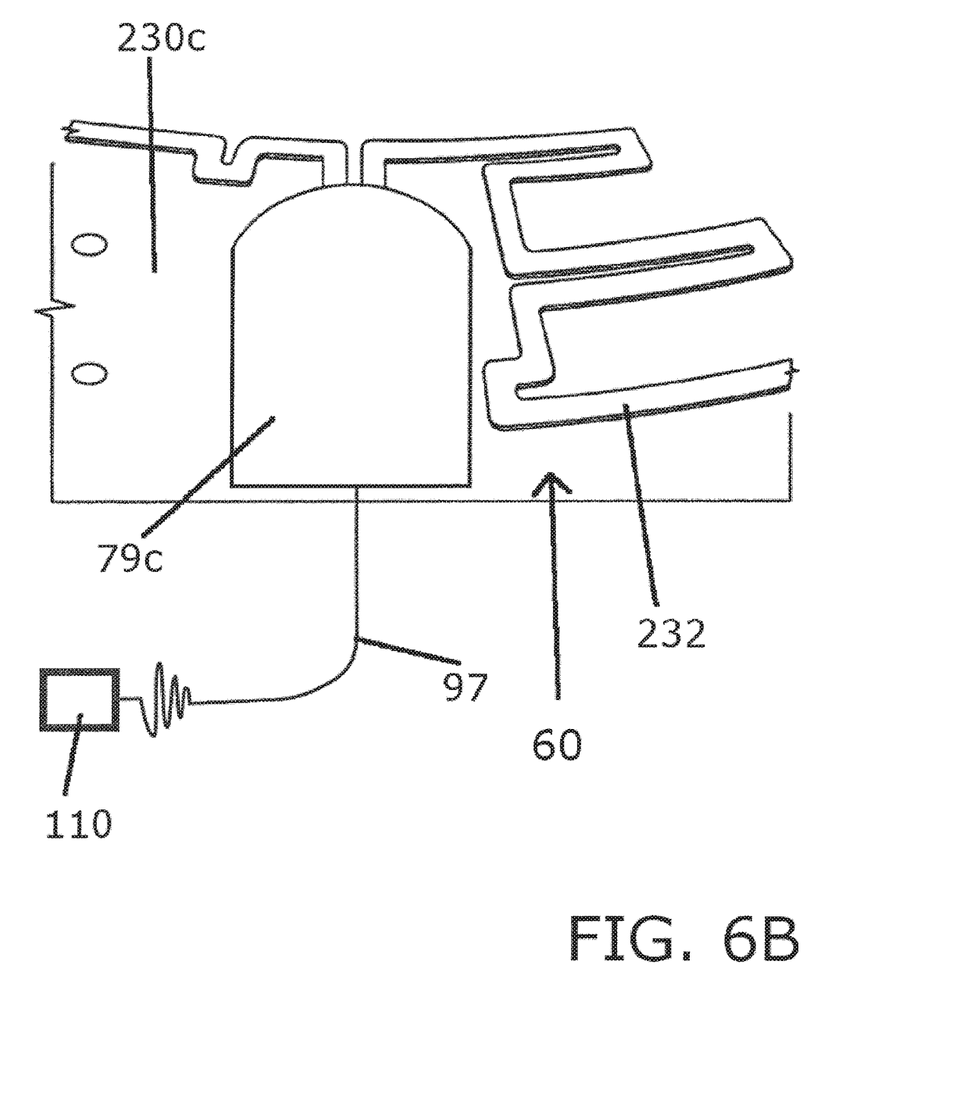

FIG. 6A,B illustrate top views of the thermal control plate 58 with compression members 300, 400, 500. The upper surface 60 of the thermal control plate 58 includes film heater 230$a$, $b$, $c$. The film heater 230$a$, $b$, $c$ can receive power from a single power supply or multiple power supplies. In a preferred embodiment, the film heater includes three heater zones 72, 74, 76, wherein the power supply 110 is electrically connected via a power line 97 extending through an opening in the flange 68 to a power supply boot 79c and electrically contacts a respective phase of the three-phase heater located in the third outer heater zone 76. The three phases of the third heater zone 76 are electrically connected to the three corresponding phases of the second intermediate heater zone 74 via connections 77 between power supply boots 79a in zone 76 and power supply boots 79b in zone 74, and the three phases of the second heater zone 74 are electrically connected to the three phases of the first central heater zone 72 via connections 77 between power supply boots 79a in the second heater zone 74 and power supply boots 79a in the first heater zone 72. The connections 77 pass through openings in the projections 61, 63.

In a preferred embodiment the three-phase heater is comprised of three circuits including a first resistive heated conductor adapted to receive AC current at a first phase, a second resistive heated conductor adapted to receive AC current at a second phase, and a third resistive heated conductor adapted to receive AC current at a third phase, the first, second and third phases being 120 degrees out of phase with each other.

The top electrode 20 can be electrically grounded, or alternatively can be powered, preferably by a radio-frequency (RF) current source. In a preferred embodiment, the top electrode 20 is grounded, and power at one or more frequencies is applied to the bottom electrode to generate plasma in the plasma processing chamber. The bottom electrode can be powered at frequencies of, for example, about 2 MHz to about 100 MHz, e.g., 2 MHz, 27 MHz and/or 60 MHz by independently controlled radio frequency power sources. After a substrate has been processed (e.g., a semiconductor substrate has been plasma etched), the supply of power to the bottom electrode is shut off to terminate plasma generation. The processed substrate is removed from the plasma processing chamber, and another substrate is placed on the substrate support 15 for plasma processing. In a preferred embodiment, the heater is activated to heat the thermal control plate 58 and, in turn, the top electrode 20, when power to the bottom electrode is shut off. As a result, the top electrode 20 temperature is preferably prevented from decreasing below a desired minimum temperature. The top electrode 20 temperature is preferably maintained at approximately a constant temperature between successive substrate processing runs so that substrates are processed more uniformly, thereby improving process yields. The power supply 110 preferably is controllable to supply power at a desired level and rate to the heater based on the actual temperature and the desired temperature of the top electrode 20.

In order to avoid delamination and potential arcing between the heater film and the thermal control plate, compression members 300, 400, 500 are located between the thermal control plate and the top plate.

As shown in FIG. 2, compression members 300, 400, 500 apply a compression force to a portion of the film heater 230a, b, c adjacent to a power supply boot 79a, 79b, 79c on an upper surface 60 of the thermal control plate 58 to prevent delamination of the film heater. The compression members 300, 400, 500 are configured to fit between the temperature-controlled top plate 80 and the thermal control plate 58 such that a lower surface of each compression member contacts an upper surface 231 of the film heater 230a, b, c and applies a compression force to a portion of the film heater 230a,b,c adjacent a power supply boot 79a, 79b, 79c which supplies power to the film heater 230a, b, c.

Each compression member 300, 400, 500 preferably includes a skirt 305, 405, 505, a top hat 310, 410, 510, and at least one flexible element 315, 415, 515 extending between the skirt 305, 405, 505 and the top hat 310, 410, 510. The skirt 305, 405, 505 is adjacent to the power supply boot 79a, 79b, 79c and has a lower surface 306, 406, 506 that contacts the upper surface 231 of the film heater 230a, b, c adjacent the power supply boot 79a, 79b, 79c. The skirt 305, 405, 505 is connected to the top hat 310, 410, 510 by at least one flexible element 315, 415, 515, and the top hat 310, 410, 510 has a lower surface 311, 411, 511 configured to rest on the power supply boot 79a, 79b, 79c and an upper surface 312, 412, 512 which makes contact with the lower surface 82 of the temperature-controlled top plate 80.

The compression members 300, 400, 500 are formed from a body of electrically insulating elastomeric material with a high tolerance for heat and resistance to halogen gases. It is preferable that the compression members 300, 400, 500 have a shape and material composition that can withstand a range of compressions from about 15 to about 250 pounds of load pressure. It is preferred that the electrically insulating elastomeric material be a fluoroelastomer wherein such fluoroelastomeric material preferably has between about 65 to 70 percent fluorine. A preferred material that provides these properties is a flouroelastomer material, such as "VITON" commercially available from E. I. du Pont de Nemours and Company.

Figure 3A:
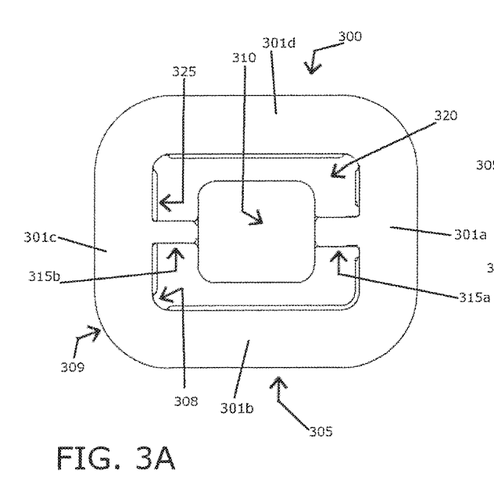
FIG. 3A-3E illustrate a compression member 300 in accordance with a first embodiment.

FIGS. 3A-3E illustrate a compression member 300 according to a first embodiment. FIG. 3A is a top view of the compression member 300 having a skirt 305, a top hat 310, a first flexible element 315a and a second flexible element 315b. The skirt 305 is defined by four walls 301a,b,c,d which form a rectangular opening 320 and has rounded corners on inner and outer surfaces 308, 309. The skirt 305 has a length of about 1.1 inches, a width of about 1.0 inch, and a height of about 0.35 inch. The rectangular opening 320 extends through the height of the skirt 305 and has a length of about 0.7 inch, and a width of about 0.5 inch. The skirt 305 has semicircular ribs 325 along lower edges of the inner surfaces 308 of the skirt 305. The semicircular ribs 325 have a radius of about 0.015 inch.

The top hat 310 is rectangular in shape having rounded corners and a length of about 0.4 inch, a width of about 0.35 inch and a height of about 0.2 inch. The top hat is connected to the skirt 305 by the first and second flexible elements 315a, 315b such that the lengths of the flexible elements 315a, 315b are aligned and parallel to the length of the skirt 305 and top hat 310 and form connections from the skirt 305 to the top hat 310 on opposite ends of the top hat 310. The first and second flexible elements 315a, 315b are rectangular in cross section with rounded edges. The first flexible element has a length of about 0.15 inch, a width of about 0.1 inch, and a thickness of about 0.03 inch. The second flexible element has a length of about 0.15 inch, a width of about 0.08 inch, and a thickness of about 0.03 inch.

Figure 3B:
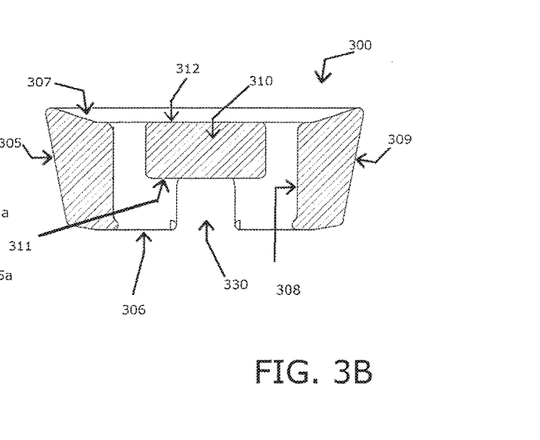

FIG. 3B is a cross section through the width of the compression member 300. The skirt has inner surfaces 308 which are parallel and outer surfaces 309 which are inclined at an angle of about 20 degrees. A portion of the upper surface 307 of the skirt 305 is inclined at an angle of about 70 degrees with respect to the vertical inner surfaces 308 wherein the upper surface 307 includes an inner horizontal section which extends about 0.05 inches from the inner surface 308 of the skirt 305 and the remainder of the upper surface 307 is inclined upwardly toward the outer surface 309 of the skirt 305. The top hat 310 has an upper surface 312 which is coplanar with the inner horizontal section of the upper surface 307 of the skirt 305.

The compression member 300 has a recess 330 in the lower surface 306 of wall 301a. The recess 330 can have a height of about 0.2 inch and a width of about 0.17 inch to fit over power line 97 extending from the power supply boot 79a. The lower surface 306 of the skirt 305 contacts the film heater 230a, b, c on the upper surface 60 of the thermal control plate 58, while the lower surface 311 of the top hat 310 contacts the upper surface of the power supply boot 79a.

Figures 3C, 3D, 3E:
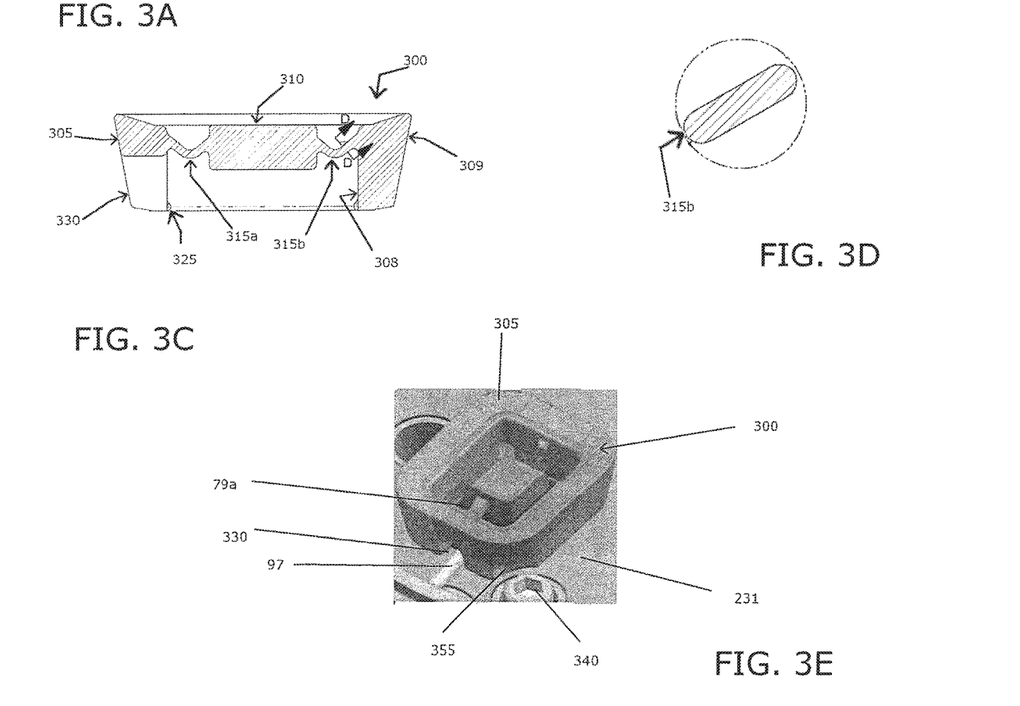

FIG. 3C is a cross section through the length of compression member 300. The first and second flexible elements 315a, 315b are V-shaped and have an inner angle of about 100 degrees. The recess 330 is centered through the width of the skirt 305 such that it is adjacent to the first flexible element 315a (see FIG. 3A).

FIG. 3D is a cross section through the length of half of the second flexible element 315b.

FIG. 3E is a perspective top view of compression member 300. Compression member 300 sits over power supply boot 79a such that the skirt 305 surrounds the periphery of power supply boot 79a. Recess 330 allows power line 97 to extend through the compression member 300 into the power supply boot 79a. In an embodiment, compression member 300 may have a carve-out 355 in skirt 305 such that a proximate screw 340 may be accommodated.

Figure 4A:
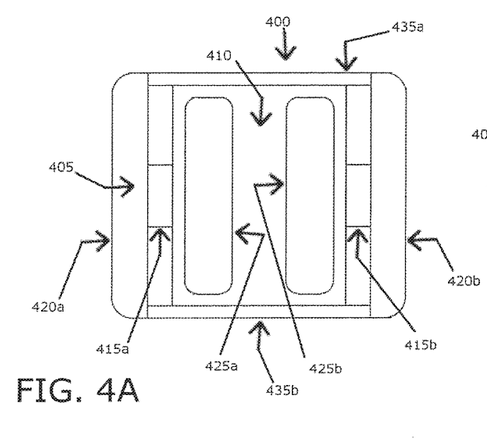
FIG. 4A-4F illustrate a compression member 400 in accordance with a second embodiment.

FIGS. 4A-4F illustrate a compression member 400 according to a second embodiment to be used in a showerhead electrode assembly of a capacitively coupled plasma chamber. FIG. 4A is a top view of the compression member 400 comprised of a skirt 405, a top hat 410, a first flexible element 415a and a second flexible element 415b. The skirt 405 is defined by first and second end walls 420a, 420b. The first end wall 420a and the second end wall 420b are parallel, spaced apart, and have a length of about 0.6 inch, a width of about 0.1 inch, and a height of about 0.35 inch. The end walls 420a, 420b are connected by two parallel and spaced apart first and second side walls 435a, 435b. The side walls 435a, 435b have a length of about 0.55 inch, a width of about 0.03 inch, and a height of about 0.13 inch The top hat 410 comprises a plate which has a length of about 0.55 inch parallel to the first and second end walls 420a, 420b, a width of about 0.4 inch parallel to the first and second side walls 435a, 435b, and a height of about 0.04 inch. The skirt 405 is connected to the top hat 410 by a first flexible element 415a and a second flexible element 415b such that the flexible elements 415a, 415b are aligned and parallel to the length of the skirt 405 and the top hat 410, and form connections from the skirt 405 to the top hat 410 on opposite ends of the top hat 410. The first flexible element 415a and the second flexible element 415b are rectangular in cross section with rounded corners and with a length of about 0.06 inch, a width of about 0.15 inch and a thickness of about 0.035 inch.

Figure 4B:
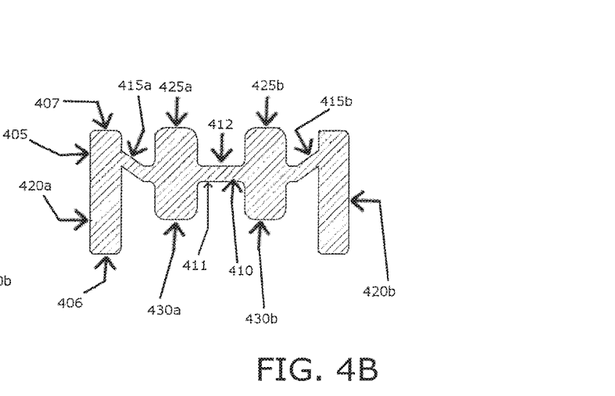

FIG. 4B is a cross section through the length of the compression member 400. The first and second flexible elements 415a, 415b include a bend forming an inner angle of about 145 degrees. The first and second flexible elements 415a, 415b connect the skirt 405 and the top hat 410 such that the upper surface 407 of the skirt 405 and the upper surface 412 of the top hat 410 are parallel to each other.

The upper surface 412 of the top hat 410 comprises first and second upper protrusions 425a, 425b, and the lower surface 411 of the top hat 410 comprises first and second lower protrusions 430a, 430b. The protrusions 425a, 425b, 430a, 430b are parallel to each other, rectangular in cross section and have a length of about 0.5 inch, a width of about 0.12 inch, and a height of about 0.1 inch. The first upper protrusion 425a and the first lower protrusion 430a are aligned vertically and the second upper protrusion 425b and second lower protrusion 430b are aligned vertically. The upper protrusions 425a, 425b and lower protrusions 430a, 430b are parallel to the first and second end walls 420a, 420b and spaced apart by about 0.13 inch.

Figure 4C:
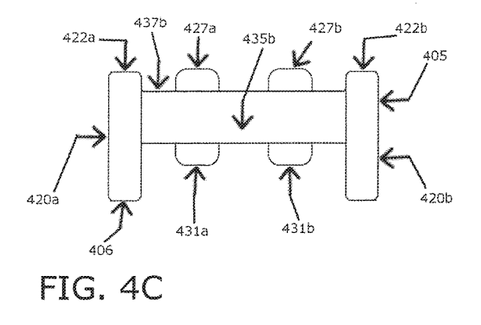

FIG. 4C is a side view of the compression member 400. The first and second side walls 435a, 435b have an upper surface 437a, 437b which is about 0.05 inch below upper surfaces 422a, 422b of the first and second end walls 420a, 420b. The lower surface 406 of the skirt 405 contacts the film heater 230a, b, c on the upper surface 60 of the thermal control plate 58. The lower surfaces 431a, 431b of the lower protrusions 430a, 430b rest on the power supply boot 79b. The upper surfaces 427a, 427b of the first upper protrusion 425a and the second upper protrusion 425b are parallel to and located about 0.007 inch above the upper surfaces 422a, 422b of the end walls 420a, 420b. The lower surfaces 431a, 431b of the first lower protrusion 430a and the second lower protrusion 430b are about 0.1 inch above the lower surfaces 421a, 421b of the end walls 420a, 420b.

Figure 4D:
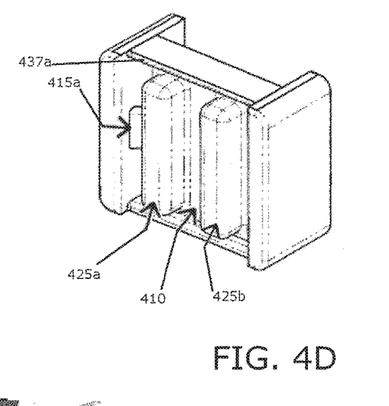
Figure 4E:
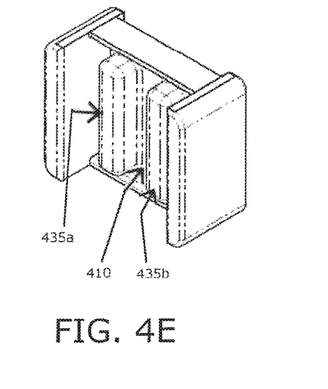

FIG. 4D-E are three dimensional drawings of compression member 400. FIG. 4D is a perspective top view of the compression member 400 wherein the first and second upper protrusions 425a, 425b have rounded corners with a radius of about 0.03 inch. FIG. 4E is a perspective bottom view of the compression member 400 wherein the first and second lower protrusions 430a, 430b have rounded corners with a radius of about 0.03 inch.

Figure 4F:
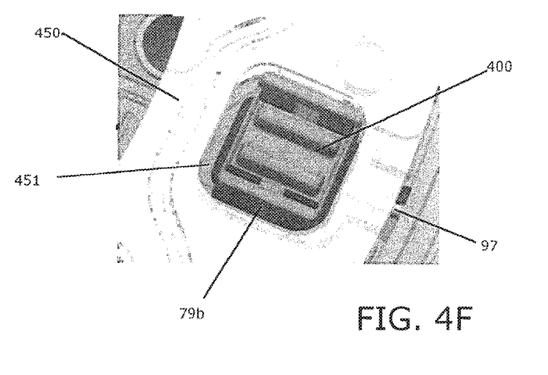

FIG. 4F illustrates an embodiment of a compression member 400 located adjacent a power supply boot 79b. In a preferred embodiment, a thermally and electrically conductive annular gasket 450 having a recess 451 spaced to fit over each compression member 400 and power supply boot 79b is provided such that each recess 451 of the annular gasket 450 supports each compression member 400 which undergoes thermal expansion during plasma etching.

Figure 5A:
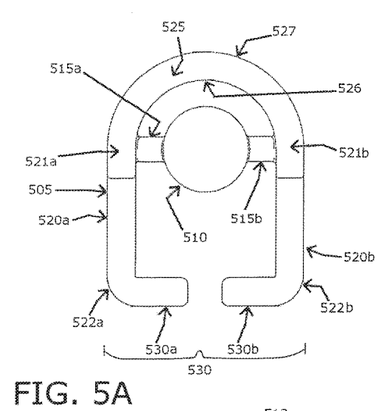
FIG. 5A-5F illustrate a compression member 500 in accordance with a third embodiment.

FIG. 5A-5F illustrate a compression member 500 to be used in a showerhead electrode assembly of a capacitively coupled plasma chamber. FIG. 5A is a top view of the compression member 500 and is comprised of a skirt 505, a top hat 510, a first flexible element 515a, and a second flexible element 515b. The skirt 505 is defined by a first side wall 520a, a second side wall 520b, which are parallel and spaced apart, interconnected on first ends 521a, 521b by a semicircular end wall 525, and have a segmented wall 530 extending from second ends 522a, 522b of the first side wall 520a and the second side wall 520b. The segmented wall 530 includes segments 530a, 530b which have a height of about 0.15 inch, a width of about 0.13 inch, and extend from the second ends 522a, 522b of the side walls 520a, 520b for about 0.025 inch with a gap of about 0.15 inch therebetween.

The top hat 510 is a cylindrical plate with a radius of about 0.2 inch, a height of about 0.12 inch, and is centered in the semicircular end wall 525 which has an inner surface 526 with a radius of about 0.3 inch, an outer surface 527 with a radius of about 0.4 inch, and a height of about 0.35 inch. The skirt 505 is connected to the top hat 510 by a first flexible element 515a and a second flexible element 515b wherein the first flexible element 515a extends from and is centered at the location where the semicircular end wall 525 joins the sidewall 520a. The second flexible element 515b extends from and is centered at the location where the semicircular end wall 525 meets the sidewall 520b. The first and second flexible elements have a length of about 0.12 inch, a width of about 0.11 inch, and a thickness of about 0.03 inch.

Figure 5B:
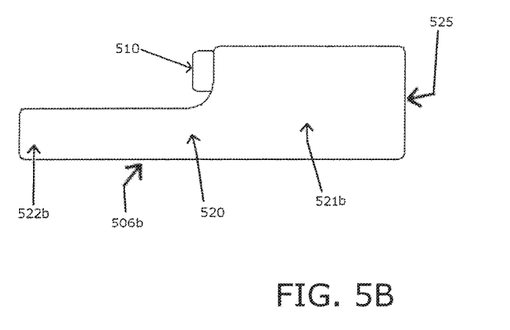

FIG. 5B is a side view of the compression member 500. The first and second side walls 520a, 520b have a length of about 0.7 inch, and a width of about 0.13 inch. The side walls 520a, 520b have rounded corners and one end has the same height as semicircular end wall 525 for a distance of about 0.12 inch and the remainder of the side walls 520a, 520b have the same height as the segmented wall 530.

Figures 5C, 5D, 5E, 5F:
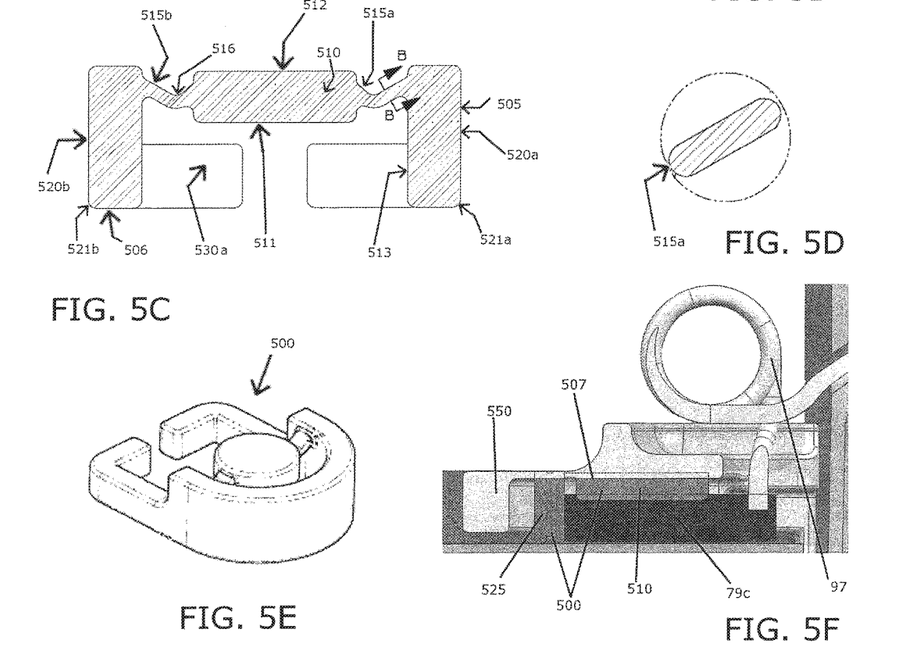

FIG. 5C is a cross section through the width of the compression member 500. The first and second flexible elements 315a, 315b include a bend at an inner angle of about 110 degrees. The lower surface 506 of the skirt 505 contacts the film heater 230a, b, c on the upper surface 60 of the thermal control plate 58, while the lower surface 511 of the top hat 510 rests on the power supply boot 79c.

FIG. 5D is a cross-section of flexible member 515a. FIG. 5E is a perspective top view of the compression member 500.

As illustrated in FIG. 5F, each compression member 500 is located adjacent a power supply boot 79c wherein each compression member 500 is compressed by a metal clamp 550 located between the upper surface 507 of the compression member 500 and the lower surface 82 of the temperature-controlled top plate 80. The clamp 550 preferably is made out of a metal such as aluminum and redistributes pressure on the compression member 500 such that the pressure is spread over a greater area of the compression member 500, facilitating connection of the power supply line 97 to an upper surface of the power supply boot 79c which delivers power from the power supply 110 to the film heater 230c.

While the invention has been described in detail with reference to specific embodiments thereof, it will be apparent to those skilled in the art that various changes and modifications can be made, and equivalents employed, without departing from the scope of the appended claims.

What is claimed is:

1. A thermal control plate of a showerhead electrode assembly, comprising:
    a film heater;
    a plurality of power supply boots, wherein each power supply boot electrically contacts a respective film heater section; and
    a plurality of compression members, wherein each compression member is adjacent a respective one of the power supply boots and contacts a portion of a respective film heater section.

2. The thermal control plate of claim 1, further comprising a showerhead electrode attached to the thermal control plate to provide a thermal path therewith.

3. The thermal control plate of claim 2, further comprising a top plate of a capacitively coupled plasma chamber, wherein the top plate is attached to the thermal control plate to provide a thermal path therewith.

4. The thermal control plate of claim 1, wherein:
    each of the compression members comprises a body of electrically insulating elastomeric material configured to fit between a temperature-controlled top plate and the thermal control plate; and
    a lower surface of the body contacts an upper surface of the film heater and applies a compression force to a portion of the film heater adjacent a power supply boot supplying power to the film heater.

5. The thermal control plate of claim 4, wherein:
    the body includes a skirt, a top hat, and at least one flexible element extending between the skirt and the top hat;
    the skirt has a height greater than a height of the top hat;
    the top hat is configured to fit between the temperature-controlled top plate and a power supply boot; and
    a lower surface of the top hat contacts an upper surface of the power supply boot and applies a compression force to the power supply boot and the skirt having a lower surface that contacts the upper surface of the film heater.

6. The thermal control plate of claim 5, wherein the skirt at least partially surrounds the power supply boot and has a rectangular shape, a circular shape, a semicircular shape, a shape with one end semicircular and another end open, or any combination thereof.

7. The thermal control plate of claim 5, wherein the skirt includes four walls defining a rectangular opening, a lower surface of one of the walls having a recess therein sized to fit over a power line into the power supply boot, the top hat being located in the rectangular opening and connected to two of the walls of the skirt by two flexible elements.

8. The thermal control plate of claim 5, wherein:
    the skirt includes two parallel and spaced apart end walls, two parallel and spaced apart side walls extending between the end walls; and
    the top hat includes a rectangular plate parallel to the upper surface of the power supply boot extending between the side walls with two parallel and spaced apart protrusions above and below the rectangular plate and oriented parallel to the end walls of the skirt, the rectangular plate being connected to the end walls of the skirt by two flexible elements.

9. The thermal control plate of claim 5, wherein:
    the skirt includes two parallel and spaced apart side walls, a semicircular end wall interconnecting first ends of the side walls, and a segmented end wall extending from opposite ends of the side walls;
    the side walls of the skirt are configured to surround an outer periphery of the power supply boot; and
    the top hat is connected to the side walls of the skirt by two flexible elements.

10. The thermal control plate of claim 5, wherein each of the at least one flexible element has a uniform cross-section and includes a bend along a length thereof.

11. The thermal control plate of claim 5, wherein the top hat is rectangular or cylindrical in shape.

12. The thermal control plate of claim 4, wherein the body has an opening in the lower surface and an inner surface of the opening is configured to completely surround an outer periphery of a power supply boot.

13. The thermal control plate of claim 4, wherein the compression members are fabricated from a fluoroelastomeric material.

14. The thermal control plate of claim 1, wherein the film heater comprises a first heater zone, a second heater zone surrounding the first heater zone, and a third heater zone surrounding the second heater zone.

15. The thermal control plate of claim 14, wherein the thermal control plate comprises:
    three power supply boots located along a first radius in the first heater zone and electronically connected to three inner power supply boots located along a second radius in the second heater zone;
    three outer power supply boots located along a third radius in the second heater zone electronically connected to three inner power supply boots located along a fourth radius in the third heater zone; and three outer power supply boots located along a fifth radius in the third heater zone electronically connected to a power supply.

16. The thermal control plate of claim 15, wherein:

the compression members include three compression members in the first heater zone, three inner compression members in the second heater zone, and three inner compression members in the third heater zone, each of the compression members including a body of electrically insulating elastomeric material;

the body includes a skirt, a top hat, and two flexible elements, the skirt including four walls defining a rectangular opening, one of the walls having a recess in a lower surface fitted over a power line into a power supply boot, the top hat being located in the rectangular opening of the skirt and connected to two walls of the skirt by the two flexible elements; and the skirt fits between a temperature-controlled top plate and the film heater, and the top hat fits between the temperature-controlled top plate and the power supply boot such that a compression force is applied to the film heater and the power supply boot.

17. The thermal control plate of claim 15, wherein:

the compression members include three outer compression members in the second heater zone, each of the compression members including a body of electrically insulating elastomeric material;

the body includes a skirt, a top hat, and two flexible elements, the skirt including two parallel and spaced apart end walls, two parallel and spaced apart side walls extending between the end walls, the top hat including a rectangular plate parallel to an upper surface of a power supply boot extending between the side walls with two parallel and spaced apart protrusions above and below the rectangular plate, oriented parallel to the end walls of the skirt, the rectangular plate being connected to the end walls of the skirt by two flexible elements; and the skirt fits between a temperature-controlled top plate and the film heater, and the top hat fits between the temperature-controlled top plate and the power supply boot such that a compression force is applied to the film heater and the power supply boot.

18. The thermal control plate of claim 15, wherein:

the compression members include three outer compression members in the third heater zone, each of the compression members including a body of electrically insulating elastomeric material;

the body includes a skirt, a top hat, and two flexible elements, the skirt including two parallel and spaced apart side walls, a semicircular end wall interconnecting first ends of the side walls, a segmented end wall extending from opposite ends of the side walls, the side walls of the skirt surrounding an outer periphery of a power supply boot, the top hat connected to the side walls of the skirt by two flexible elements; and the skirt fits between a temperature-controlled top plate and the film heater, and the top hat fits between the temperature-controlled top plate and the power supply boot such that a compression force is applied to the film heater and the power supply boot.

* * * * *